United States Patent
Hong

(10) Patent No.: US 10,607,697 B2
(45) Date of Patent: Mar. 31, 2020

(54) SEMICONDUCTOR SYSTEM INCLUDING A PHASE CHANGEABLE MEMORY DEVICE

(71) Applicant: SK hynix Inc., Icheon-si, Gyeonggi-do (KR)

(72) Inventor: Yun Seok Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/581,885

(22) Filed: Apr. 28, 2017

(65) Prior Publication Data

US 2018/0061491 A1 Mar. 1, 2018

(30) Foreign Application Priority Data

Aug. 30, 2016 (KR) .......................... 10-2016-0110975

(51) Int. Cl.
 *G11C 13/00* (2006.01)
(52) U.S. Cl.
 CPC ...... *G11C 13/0033* (2013.01); *G11C 13/0004* (2013.01); *G11C 13/0023* (2013.01); *G11C 13/0061* (2013.01); *G11C 13/0028* (2013.01); *G11C 2213/30* (2013.01); *G11C 2213/52* (2013.01); *G11C 2213/76* (2013.01)
(58) Field of Classification Search
 CPC ... G11C 8/00; G11C 11/5614; G11C 11/5678; G11C 13/0004; G11C 13/0033; G11C 13/0023; G11C 13/0061; G11C 13/0028

USPC ....................................... 365/63, 148, 189.2
See application file for complete search history.

(56) References Cited

U.S. PATENT DOCUMENTS

| | | | |
|---|---|---|---|
| 2007/0279975 A1* | 12/2007 | Hudgens | G11C 13/0004 365/163 |
| 2012/0075947 A1* | 3/2012 | Kang | G11C 11/40615 365/222 |
| 2014/0059287 A1* | 2/2014 | Bains | G11C 11/40615 711/106 |
| 2017/0133085 A1* | 5/2017 | Kim | G06F 3/0619 |

FOREIGN PATENT DOCUMENTS

KR 1020150099170 A 8/2015

\* cited by examiner

*Primary Examiner* — Alfredo Bermudez Lozada
(74) *Attorney, Agent, or Firm* — William Park & Associates Ltd.

(57) ABSTRACT

A semiconductor system may be provided. The semiconductor system may include a phase changeable memory device. The phase changeable memory device may include a phase changeable memory cell array, the phase changeable memory cell array may include a plurality of word lines, a plurality of bit lines overlapped with the word lines and phase changeable memory cells respectively connected to overlapping points between the word lines and the bit lines, and the phase changeable memory cell may include a phase changeable material. The semiconductor system may include a controller. The controller may be configured to provide the phase changeable memory device with a command and an address for controlling the phase changeable memory device.

10 Claims, 7 Drawing Sheets

SEMICONDUCTOR SYSTEM INCLUDING A PHASE CHANGEABLE MEMORY DEVICE

CROSS-REFERENCES TO RELATED APPLICATION

The present application claims priority under 35 U.S.C. § 119(a) to Korean application number 10-2016-0110975, filed on Aug. 30, 2016, in the Korean Intellectual Property Office, which is incorporated herein by reference in its entirety.

BACKGROUND

1. Technical Field

Various embodiments may generally relate to a semiconductor memory system, and more particularly, to a phase changeable memory system.

2. Related Art

Recently, computing devices may use memory devices. The memory devices used may be two-level memory devices. Examples of two-level memory devices are cross point arrays or solid state drives (SSD). The memory devices may include a non-volatile memory such as an NAND flash, a NOR flash, a phase changeable memory, etc. Important system data, such as a firmware image, with respect to the computing devices and/or the memory devices, may be stored in the non-volatile memory. When important data relating to the system is damaged, the computing devices or the memory devices may malfunction and cause the computing device or the memory devices to lock up.

The phase changeable memory device may have a drift where stored information may be changed in accordance with a time lapse.

The drift may cause a mismatch between read and write (read/write) information in a memory cell and set information in read/write modules. Further, it may be difficult to restore the stored data.

SUMMARY

According to an embodiment, there may be provided a semiconductor system. The semiconductor system may include a phase changeable memory device. The phase changeable memory device may include a phase changeable memory cell array, the phase changeable memory cell array may include a plurality of word lines, a plurality of bit lines overlapped with the word lines and phase changeable memory cells respectively connected to overlapping points between the word lines and the bit lines, and the phase changeable memory cell may include a phase changeable material. The semiconductor system may include a controller. The controller may be configured to provide the phase changeable memory device with a command and an address for controlling the phase changeable memory device.

According to an embodiment, there may be provided a semiconductor system. The semiconductor system may include a phase changeable memory device and a controller. The phase changeable memory device may include a cross point array and a controlling unit. The cross point array may include a plurality of word lines, a plurality of bit lines overlapped with the word lines and phase changeable memory cells respectively connected to overlapping points between the word lines and the bit lines. The controlling unit may be configured to refresh the cross point array regularly and irregularly. The controller may be configured to provide the phase changeable memory device with a regular command, an irregular command and an address. The controller may be interfaced with the phase changeable memory device. The irregular command of the controller may be generated based on a control signal from the controlling unit.

According to an embodiment, there may be provided a semiconductor system. The semiconductor system may include a phase changeable memory device and a controller. The phase changeable memory device may include a cross point array and a controlling unit. The cross point array may include a plurality of word lines, a plurality of bit lines overlapped with the word lines and phase changeable memory cells respectively connected with overlapped points between the word lines and the bit lines. The phase changeable memory cells may include a phase changeable material. The controlling unit may be configured to control the cross point array. The controller may be coupled with the phase changeable memory device. The controlling unit may be configured to generate a refresh section signal enabled in a refresh operation based on a refresh entry signal and a refresh exit signal of the cross point array, which may be generated based on the command. The controller may not output the command when the enabled refresh section signal may be inputted.

DETAILED DESCRIPTION

Figure 1:
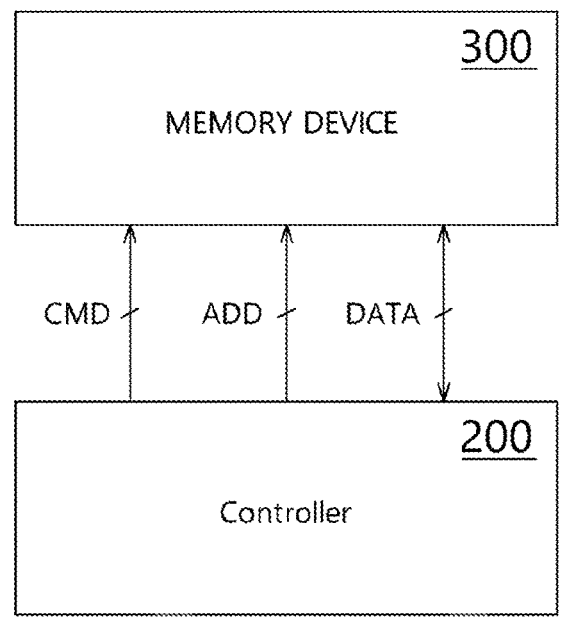
FIG. 1 is a block diagram illustrating a representation of an example of a semiconductor memory system in accordance with various examples of embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of the embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a block diagram illustrating a representation of an example of a semiconductor memory system in accordance with various examples of embodiments.

Referring to FIG. 1, a semiconductor system 100 may include a controller 200 and a memory device 300. In an embodiment, for example, the semiconductor system 100 may be a phase changeable memory system including a memory device 300, which may include a phase changeable memory device, and a controller 200. The controller 200 may be configured to provide the memory device 300 with a plurality of commands CMD and a plurality of addresses ADD. Data DATA may be interfaced or sent and received between the controller 200 and the memory device 300.

Figure 2:
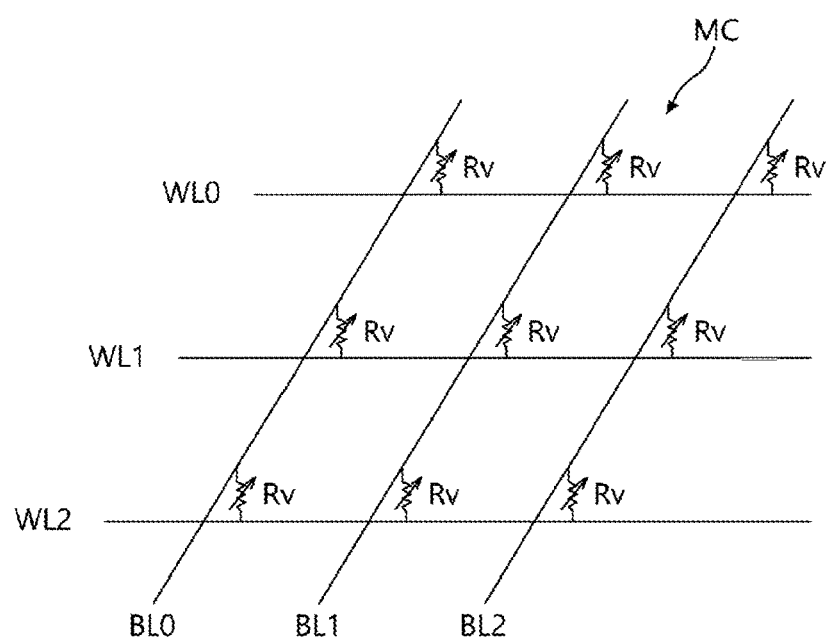
FIG. 2 is a circuit diagram illustrating a representation of an example of a phase changeable memory device in accordance with various examples of embodiments.

FIG. 2 is a circuit diagram illustrating a representation of an example of a phase changeable memory device in accordance with various examples of embodiments.

Referring to FIG. 2, the memory device 300 may include a two-level phase changeable memory device. The phase changeable memory device 300 may include, for example but not limited to, a plurality of word lines WL0-WL2, and a plurality of bit lines BL0-BL2 intersected with the word lines WL0-WL2. The phase changeable memory device 300 may further include a cross point memory array. The cross point memory array may include phase changeable memory cells MC positioned at points of intersection between the word lines WL0-WL2 and the bit lines BL0-BL2. The phase changeable memory cells MC may include a phase changeable layer Rv as a storing media. In an embodiment, the cross point memory array may include phase changeable memory cells MC positioned at points of overlap between the word lines WL0-WL2 and the bit lines BL0-BL2.

Figure 3:
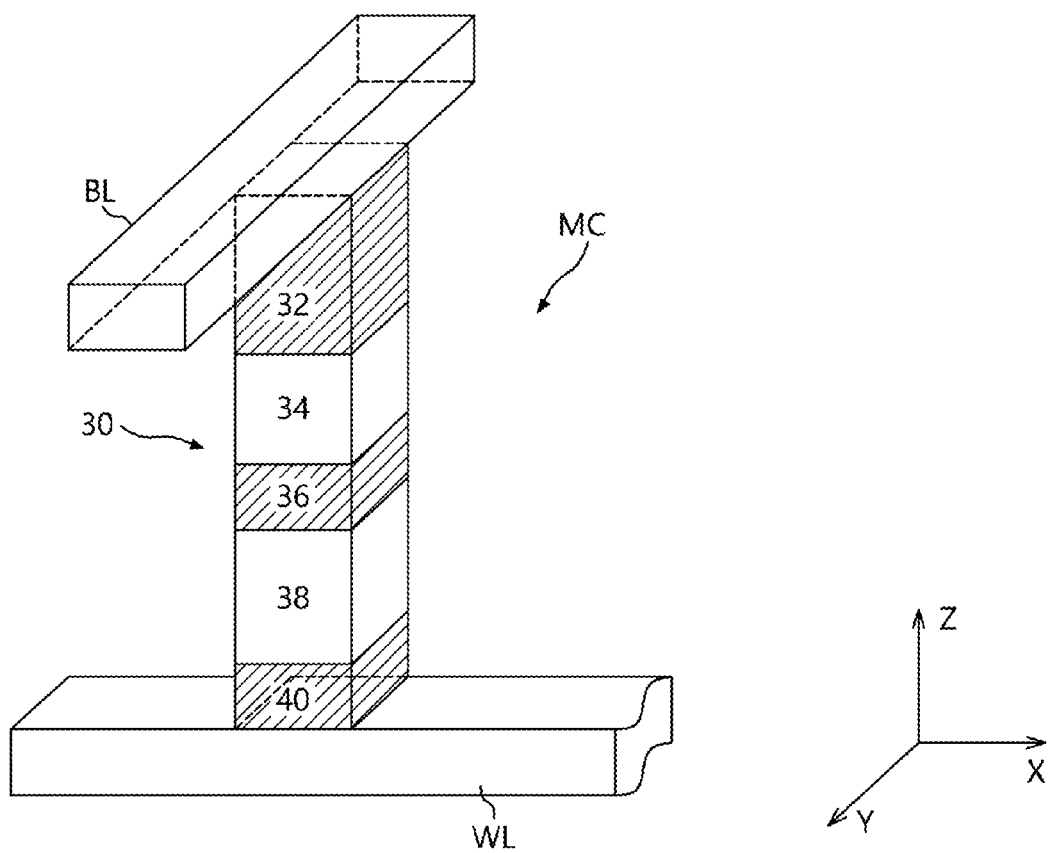
FIG. 3 is a perspective view illustrating a representation of an example of a unit memory cell of the phase changeable memory system in accordance with various examples of embodiments.

FIG. 3 is a perspective view illustrating a representation of an example of a unit memory cell of the phase changeable memory device in accordance with various examples of embodiments.

Referring to FIG. 3, the phase changeable memory cell MC may include a word line WL extended in a row direction, i.e., an x-direction, and a bit line BL extended in a column direction, i.e., a y-direction over the word line WL. The phase changeable memory cell MC may include a first electrode 32, a selector 34, a middle electrode 36, a storing media 38 and a second electrode 40. For example, the first electrode 32 may be communicated with the bit line BL. In an embodiment, for example, the bit line BL may extend in the column direction and overlap the word line extended in the row direction, and the bit lines may be connected to the word lines through the phase changeable memory cells, respectively, at overlapping points between the word lines and the bit lines. The selector 34 may be formed under the first electrode 32. The middle electrode 36 may be formed under the selector 34. The storing media 38 may be formed under the middle electrode 36. The second electrode 40 may be formed between the storing media 38 and the word line WL.

In various examples of embodiments, any one of the storing media 38 and the selector 34 may include a phase changeable material such as chalcogenide. When the storing media 38 and the selector 34 may be phase-changed in room temperature. The selector 34 may have phase change characteristics different from those of the storing media 38. For example, a composition of the selector 34 may be different form that of the storing media 38.

The storing media 38 may include an alloy including at least two of In, Sb and Te, and an alloy including at least two elements of Ge—Sb—Te. For example, the storing media 38 may include an alloy including at least two elements of In2Sb2Te5, In1Sb2Te4 and In1Sb4Te7, and an alloy including at least two elements of Ge8Bb5Te8, Ge2Sb2Te5, Ge1Sb2Te4, Ge1Sb4Te7 and Ge4Sb4Te7. The chalcogenide alloy of the storing media 38 may include Ge—Te, Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, etc.

The middle electrode 36 may correspond to a connection node between the selector 34 and the storing media 38. The middle electrode 36 may form a two-terminal type selector together with the first electrode 32. The selector 34 may include an Ovonics threshold switch (OTS). The OTS may include the above-mentioned chalcogenide material. The selector 34 may further include an element for suppressing a crystallization such as As. The element such as As may prevent formation or growth of nucleus in the alloy to suppress the crystallization. Thus, when a voltage higher than a critical voltage (for example, a threshold voltage) may be applied to the selector 34, the selector 34 may be switched to a conductive state. A sufficient amount of a current may be supplied to the selector 34 during the conductive state. The selector 34 may include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, Ge—As—Bi—Se, etc.

A resistance of the phase changeable memory cell, i.e., the storing media 38 may be changed after a predetermined time has lapsed. Thus, when read/write operations are performed, a drift causing data error may be generated.

In order to prevent the generation of a drift, the phase changeable memory device may be refreshed regularly and irregularly.

Figure 4:
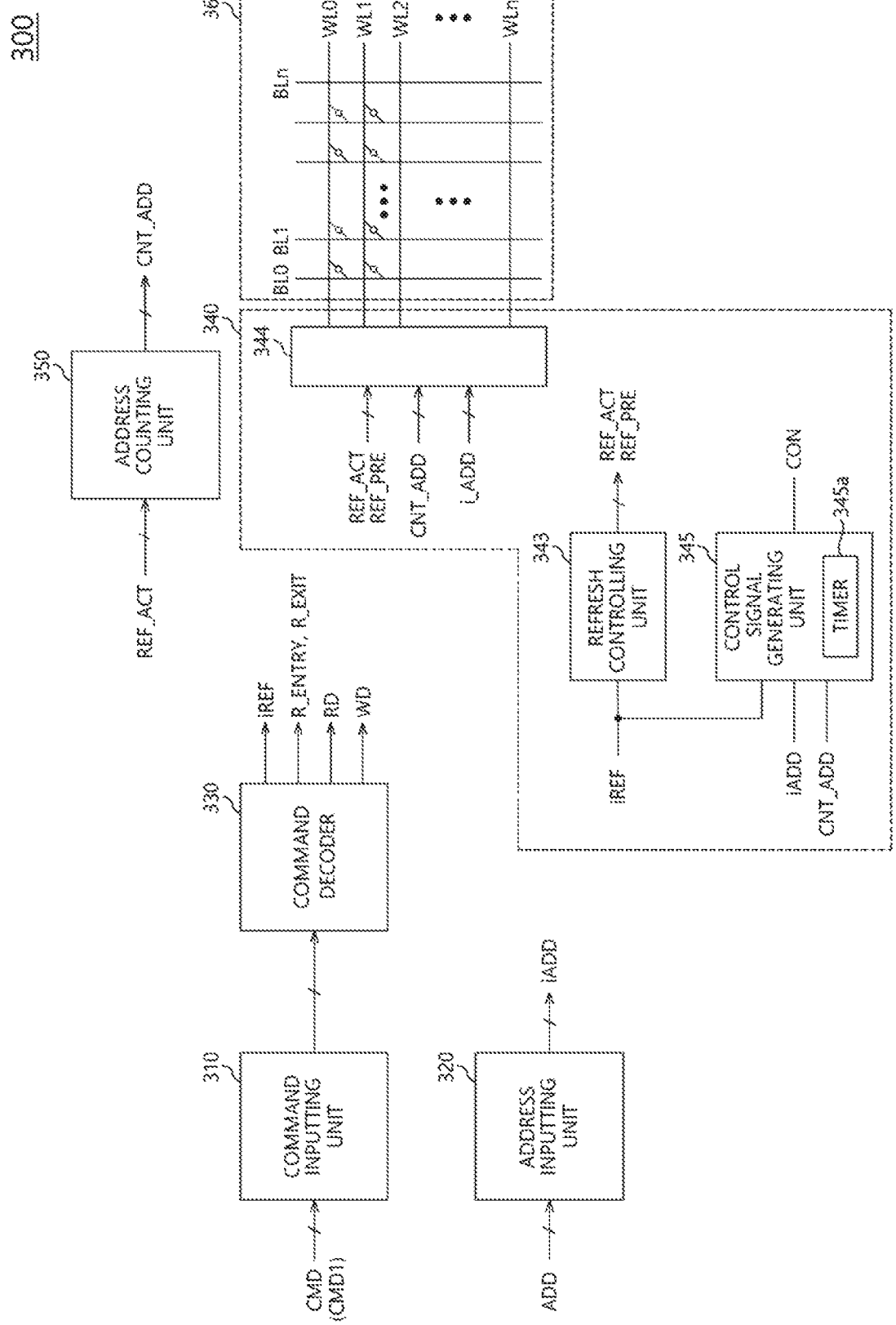
FIG. 4 is a block diagram illustrating a representation of an example of a phase changeable memory system in accordance with various examples of embodiments.

FIG. 4 is a block diagram illustrating a representation of an example of a phase changeable memory device in accordance with various examples of embodiments.

Referring to FIG. 4, the phase changeable memory device 300 may include a command-inputting unit 310, an address-inputting unit 320, a command decoder 330, a controlling unit 340, an address-counting unit 350 and a phase changeable memory cell array 360.

The command-inputting unit 310 may receive the command CMD (or CMD1) from the controller 200.

The address-inputting unit 320 may receive the address ADD from the controller 200 to generate an input address iADD applied to the phase changeable memory cell array 360.

The command decoder 330 may decode the command CMD inputted through the command-inputting unit 310 to generate a refresh command iREF, which may not be required in conventional phase changeable memory devices. The refresh command iREF may be generated by manners substantially the same as those for generating a refresh command of a DRAM device. The command decoder 330 may decode the command CMD to generate an active command ACT, a read command RD and a write command WD. Alternatively, the command decoder 330 may generate various commands as well as the above-mentioned commands.

The phase changeable memory cell array 360 may include a cross point memory array using a phase changeable layer as a selector and a storing media in FIGS. 2 and 3.

The address-counting unit 350 may count the address ADD when the word lines in the phase changeable memory cell array 360 are refreshed to generate a counting address CNT_ADD. When a refresh signal REF_ACT is activated, the address-counting unit 350 may perform the counting operation. The counting address CNT_ADD may be used for sequentially counting the word lines.

The controlling unit 340 may regularly and irregularly refresh the phase changeable memory cell array 360 by a uniform period in response to the refresh command iREF. When performing a refresh operation, the controlling unit 340 may select word lines among the word lines WL0-WLn corresponding to the counting address CNT_ADD. When performing the active operation, the read operation or the write operation, the controlling unit 340 may select a word line among the word lines WL0-WLn corresponding to the input address iADD. The phase changeable memory cell array 360 may be sequentially refreshed by a unit word line similarly to the DRAM. The controlling unit 340 may include a refresh controlling unit 343, a row controlling unit 344 and a control signal generating unit 345.

The refresh controlling unit 343 may be configured to generate a refresh activating signal REF_ACT and a pre-charge signal REF_PRE in response to the refresh command iREF. The pre-charge signal REF_PRE may be activated at a time after the refresh activating signal REF_ACT is enabled. The refresh controlling unit 343 may include circuit configurations substantially the same as those of the DRAM.

The row controlling unit 344 may be configured to refresh a word line among the word lines WL0-WLn corresponding to the counting address CNT_ADD in response to the refresh activating signal REF_ACT. Particularly, when the refresh activating signal REF_ACT is activated, the row controlling unit 344 may activate the word line corresponding to the counting address CNT_ADD. When the pre-charge signal REF_PRE is activated, the row controlling unit 344 may pre-charge the activated word line. That is, the refresh operation in the phase changeable memory device may change physical states of the storing media 38 to equalize the resistance of the memory cell to allow data in the read/write modules of the phase changeable memory device. When the refresh operation is not performed, the row controlling unit 344 may drive a word line corresponding to the input address iADD.

The control signal generating unit 345 may receive the refresh command iREF, the counting address CNT_ADD and the input address iADD to generate a control signal CON. The control signal generating unit 345 may have a timer 345a for performing a timer function. When a word line does not perform any operations, the control signal generating unit 345 may receive the refresh command iREF, the counting address CNT_ADD and the input address iADD to generate the control signal CON.

Figure 5:
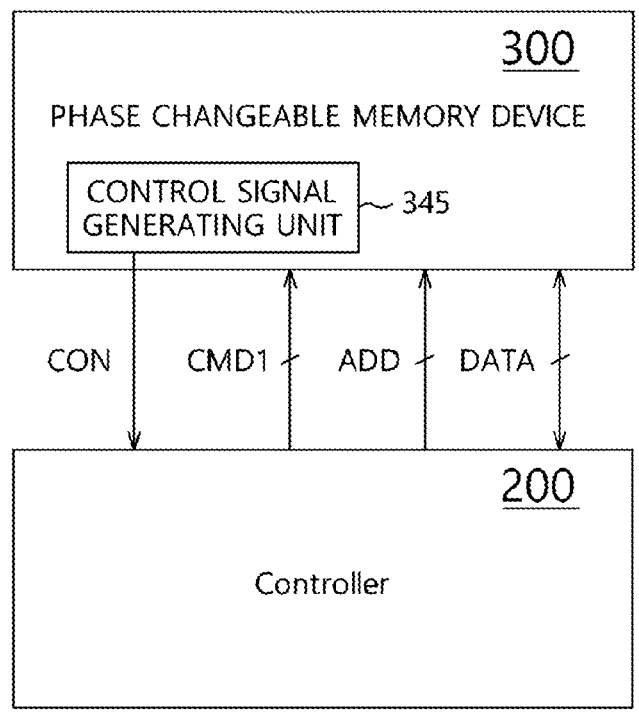
FIG. 5 is a block diagram illustrating a representation of an example of a phase changeable memory system in accordance with various examples of embodiments.

FIG. 5 is a block diagram illustrating a representation of an example of a phase changeable memory system in accordance with various examples of embodiments.

Referring to FIG. 5, the control signal CON which is generated when the word line does not perform any operations, such as, a refresh operation, an active operation, a read operation or a write operation, may be inputted into the controller 200. The controller 200 may provide the phase changeable memory device 300 with an irregular command CMD1, which may be used for refreshing the word line that may not perform any operations, in response to the control signal CON inputted from the control signal generating unit 345. In an embodiment, the control signal generating unit 345 provides the controller 200 with a control signal CON including information of a detected word line WL.

Referring to FIG. 4, the irregular command CMD1 may pass through the command inputting unit 310, the command decoder 330 and the controlling unit 340 to generate a signal 'Refresh' for refreshing any one of the word lines similarly to the regular command CMD.

Figure 6:
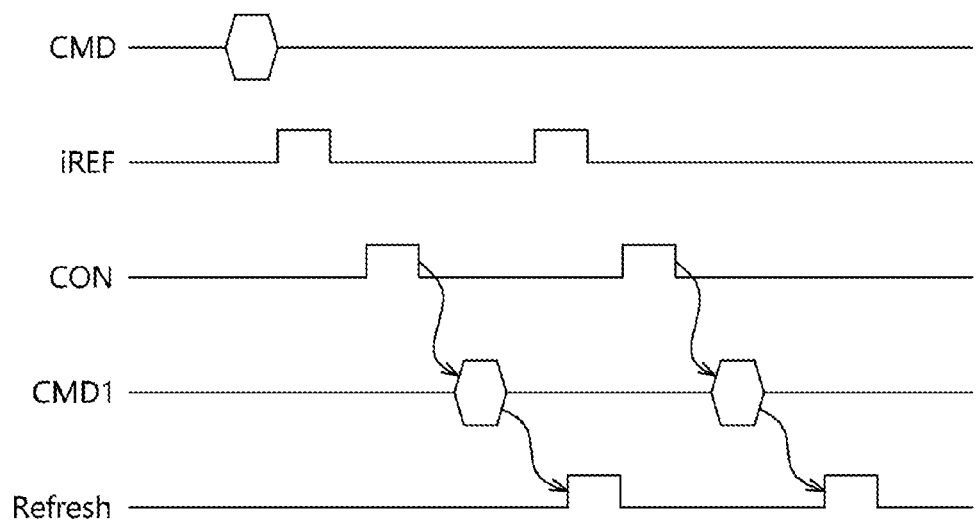
FIG. 6 is a timing chart illustrating operations of a phase changeable memory system in accordance with various examples of embodiments.

FIG. 6 is a timing chart illustrating operations of a phase changeable memory system in accordance with various examples of embodiments.

Referring to FIG. 6, the command decoder 330 of the phase changeable memory device 300 may generate the refresh command iREF by the regular command CMD provided from the controller 200.

The control signal generating unit 345 of the controller 340 may detect the word line, which may not perform any operations in a set time, to provide the controller 200 with the control signal CON.

The controller 200 may provide the phase changeable memory device 300 with the irregular command CMD1 in response to the control signal CON.

The irregular command CMD1 may be driven by manners substantially the same as those for driving the regular command CMD to output the signal 'Refresh' for driving the non-operated word line.

Therefore, the non-operated word line may be refreshed to prevent the generation of the drift.

Figure 7:
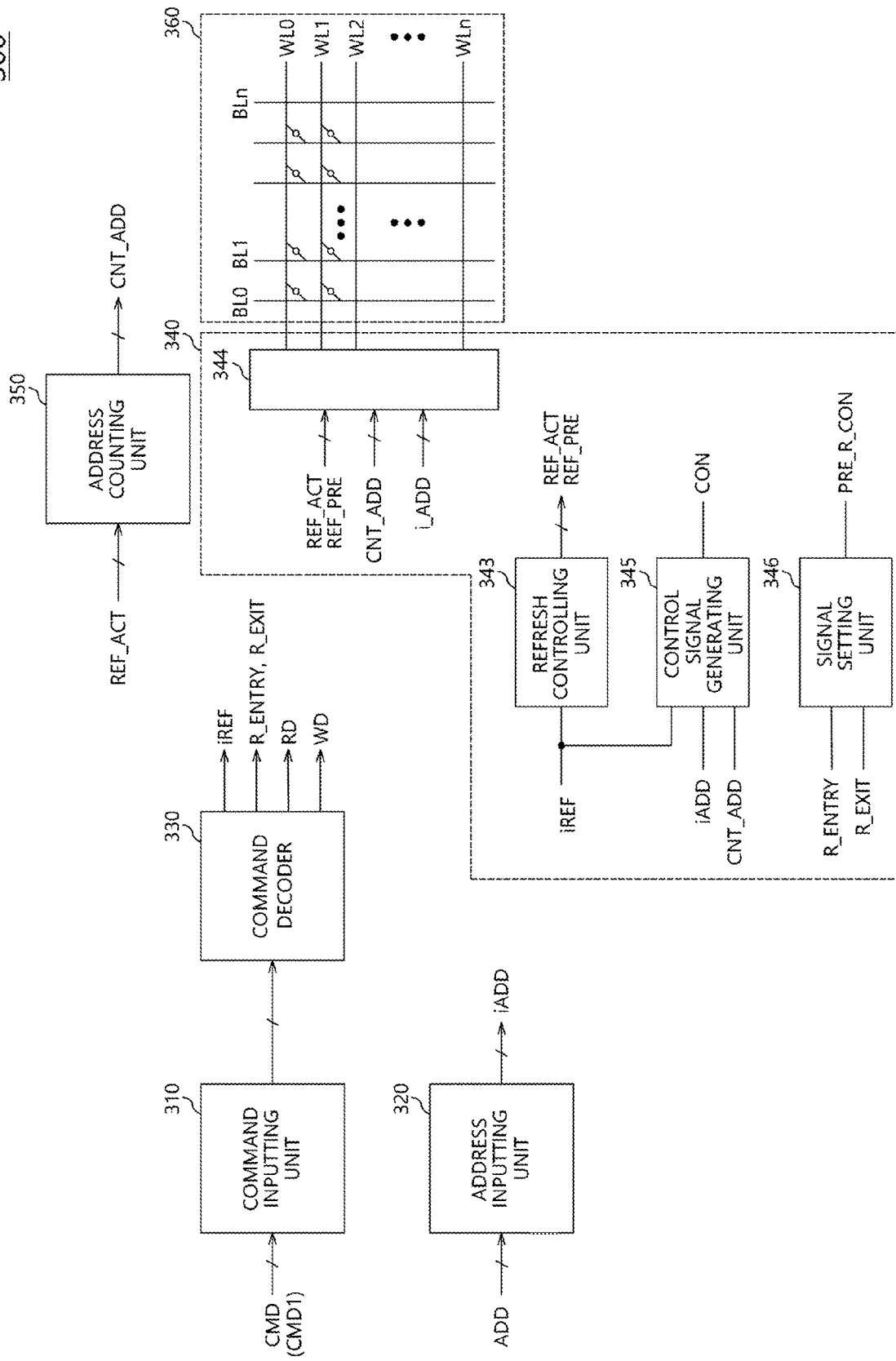
FIG. 7 is a block diagram illustrating a representation of an example of a phase changeable memory system in accordance with various examples of embodiments.

FIG. 7 is a block diagram illustrating a representation of an example of a phase changeable memory system in accordance with various examples of embodiments.

Referring to FIG. 7, the phase changeable memory device 300 (i.e., see FIG. 4) may further include a signal setting unit 346.

The signal setting unit 346 may receive a refresh enter signal R_ENTRY and a refresh exit signal R_EXIT to generate a refresh section signal PRE_R_CON. The refresh entry signal R_ENTRY and the refresh exit signal R_EXIT may be generated from the command decoder 330.

Figures 8, 9:
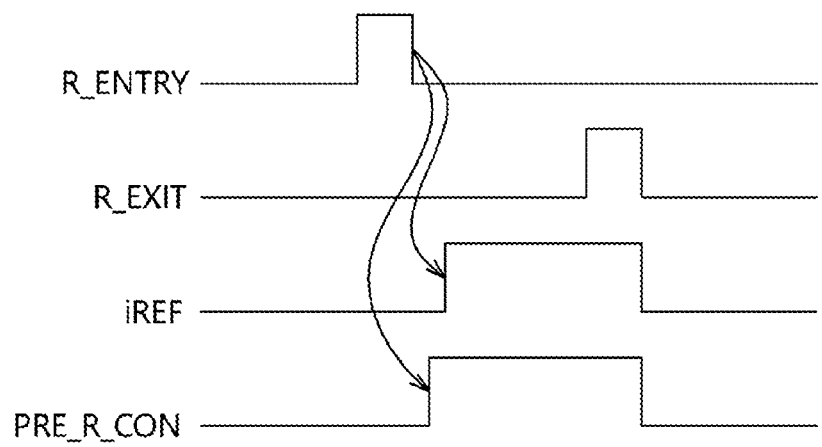
FIG. 8 is a timing chart illustrating operations of a phase changeable memory system in accordance with various examples of embodiments.
FIG. 9 is a block diagram illustrating a representation of an example of a phase changeable memory system in accordance with various examples of embodiments.

FIG. 8 is a timing chart illustrating operations of a phase changeable memory system in accordance with various examples of embodiments.

Referring to FIG. 8, the signal setting unit 346 may generate the refresh section signal PRE_R_CON. When the refresh entry signal R_ENTRY is enabled, the refresh section signal PER_R_CON may be enabled. When the refresh exit signal R_EXIT is enabled, the refresh section signal PRE_R_CON may be disabled. The refresh section signal PRE_R_CON may be enabled previously before the refresh command iREF. In other words, the refresh command iREF is enabled, after the refresh section signal PRE_R_CON is enabled. The signal setting unit 346 may be embodied by various logic gates.

FIG. 9 is a block diagram illustrating a representation of an example of a phase changeable memory system in accordance with various examples of embodiments.

Referring to FIG. 9, the refresh section signal PRE_R_CON of the signal setting unit 346 may be provided to the controller 200. When the enabled refresh section signal PRE_R_CON is inputted into the controller 200, the controller 200 may not provide the phase changeable memory device 300 with any commands. In an embodiment, for example, the output of the command CMD from the controller 200 to the phase changeable memory device 300 is temporarily stopped when the enabled refresh section signal PRE_R_CON is inputted into the controller 200. In an embodiment, for example, the output of the command CMD from the controller 200 to the phase changeable memory device 300 is temporarily stopped during the enabled refresh section signal PRE_R_CON being inputted into the controller 200.

Thus, during the refresh operation, the phase changeable memory device 300 may not perform any operations such as the read operation, the write operation, i.e., so that the resistance of the phase changeable memory device 300 may be concentrated on the refresh operation. As a result, the drift characteristics and power consumption may be improved.

According to examples of embodiments, the phase changeable memory device 300 may be periodically refreshed to prevent the generation of the drift. The phase changeable memory device 300 may detect the non-operated word line in a predetermined time. The non-operated word line may be refreshed.

Further, the phase changeable memory device 300 may include the signal setting unit configured to generate the refresh section signal PRE_R_CON enabled from the refresh entry to the refresh exit. The refresh section signal PRE_R_CON may be provided to the controller 200 so that the controller 200 does not provide the phase changeable memory device 300 with any commands during the refresh section signal PRE_R_CON while enabled. Therefore, the phase changeable memory device may concentrate on the refresh operation for preventing the drift.

Figure 10:
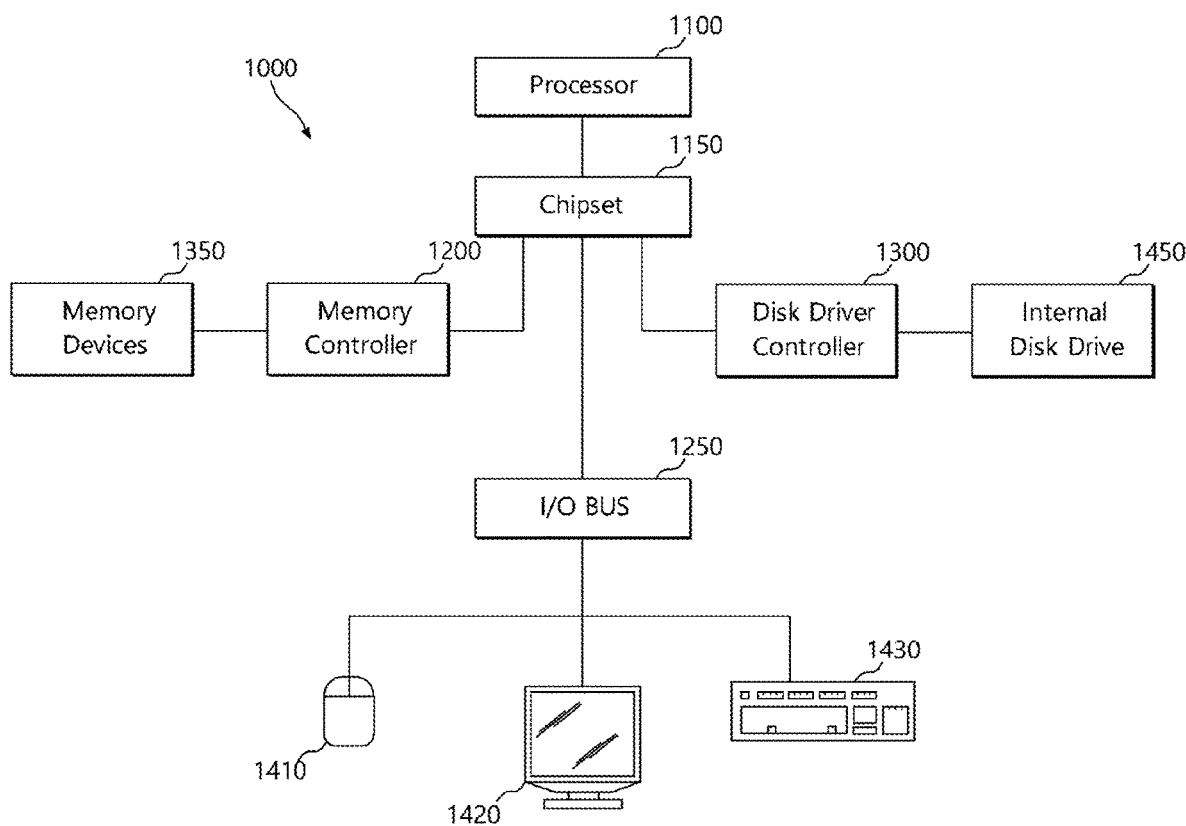
FIG. 10 illustrates a block diagram of an example of a representation of a system employing a semiconductor system and or phase changeable memory system with the various embodiments discussed above with relation to FIGS. 1-9.

The semiconductor systems and or phase changeable memory systems as discussed above (see FIGS. 1-9) are particular useful in the design of other memory devices, processors, and computer systems. For example, referring to FIG. 10, a block diagram of a system employing a semiconductor system and or phase changeable memory system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor system and or phase changeable memory system as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system and or phase changeable memory system as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a semiconductor system and or phase changeable memory system as discussed above with relation to FIGS. 1-9. In alternate embodiments, such as, for example but not limited to, cellular phones or digital cameras, the components may differ from the embodiments illustrated in FIG. 10.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor system comprising:
   a phase changeable memory device including a phase changeable memory cell array, the phase changeable memory cell array including a plurality of word lines, a plurality of bit lines overlapped with the word lines and phase changeable memory cells respectively connected to overlapping points between the word lines and the bit lines, and the phase changeable memory cell including a phase changeable material; and
   a controller configured to provide the phase changeable memory device with a command and an address for controlling the phase changeable memory device,
   wherein the phase changeable memory device includes a controlling unit configured to generate a refresh command for refreshing the word lines and address information for selecting a word line from the command, to detect a word line among the word lines, which does not perform any operations in a predetermined time based on the refresh command and the address information for selecting the word line from the command, and to provide the controller with a control signal including information of a detected word line,
   wherein the controller is configured to provide an additional command for refreshing the detected word line to the phase changeable memory device, and
   wherein the additional command is provided at a timing different from an output timing of the command, and
   wherein detecting the word line includes, detecting a word line adjacent to a selected word line or a refreshed word line and detecting a word line that is not adjacent to the selected word line or the refreshed word line, wherein the detected word line, does not perform any operation during the predetermined time and includes a word line adjacent to a selected word line or a refreshed word line, and includes a word line far apart from the selected word line or the refreshed word line.

2. The semiconductor system of claim 1, wherein the phase changeable memory device further comprises:
   a command decoder configured to decode the command from the controller to generate the refresh command, a refresh entry signal and a refresh exit signal;
   an address counting unit configured to generate a counting address changed when the word lines of the phase changeable memory cell array are refreshed; and
   an address inputting unit configured to receive the address from the controller to generate an input address, and output the input address to the phase changeable memory cell array.

3. The semiconductor system of claim 1, wherein the controlling unit comprises a control signal generating unit configured to receive a refresh command, a counting address changed when the word lines of the phase changeable memory cell array are refreshed and an input address for selecting the word line according to the operations and to detect the word line that does not perform the operations in the predetermined time.

4. The semiconductor system of claim 1, wherein the additional command is irregularly generated in the controller when the control signal is inputted into the controller.

5. The semiconductor system of claim 1, wherein the controlling unit further comprises:
   a signal setting unit configured to generate a refresh section signal enabled during a refresh operation, the duration of the enablement of the refresh section signal being based on a refresh entry signal and a refresh exit signal.

6. The semiconductor system of claim 5, wherein the output of the command from the controller to the phase changeable memory device is temporarily stopped when the enabled refresh section signal is inputted into the controller.

7. The semiconductor system of claim 1, wherein the phase changeable memory cell each comprises:
   a selector; and
   a storing media coupled to the selector, the selector arranged between a respective bit line and the storing media,
   wherein the selector comprises a phase changeable material.

8. The semiconductor system of claim 7, wherein the phase changeable memory each further comprise:
   a first electrode connected between the respective bit line and the selector;
   a middle electrode connected between the selector and the storing media; and a second electrode connected between the storing media and the respective word line, wherein the storing media comprises a phase changeable material.

9. The semiconductor system of claim 1, wherein the operations includes a refresh operation, an writing operation, a read operation and a write operation based on the command.

10. The semiconductor system of claim 5, wherein the signal setting unit further includes a timer for setting the predetermined time.

* * * * *